United States Patent
Zhou et al.

(10) Patent No.: US 8,604,351 B2
(45) Date of Patent: Dec. 10, 2013

(54) PRINTED CIRCUIT BOARD WITH CIRCUIT TOPOLOGY

(75) Inventors: Hua-Li Zhou, Shenzhen (CN); Chia-Nan Pai, New Taipei (TW); Shou-Kuo Hsu, New Taipei (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 108 days.

(21) Appl. No.: 13/335,996

(22) Filed: Dec. 23, 2011

(65) Prior Publication Data

US 2013/0048352 A1    Feb. 28, 2013

(30) Foreign Application Priority Data

Aug. 30, 2011  (CN) .......................... 2011 1 0252835

(51) Int. Cl.
*H05K 1/09* (2006.01)
(52) U.S. Cl.
USPC .......................................... 174/257; 174/255
(58) Field of Classification Search
USPC .................. 174/255, 257, 262; 361/780, 794; 333/128, 130, 136, 161; 307/11
See application file for complete search history.

(56) References Cited

U.S. PATENT DOCUMENTS

| | | | | |
|---|---|---|---|---|
| 4,356,462 A | * | 10/1982 | Bowman | 333/128 |
| 7,746,195 B2 | * | 6/2010 | Hsu et al. | 333/130 |
| 7,843,281 B2 | * | 11/2010 | Hsu et al. | 333/130 |

* cited by examiner

*Primary Examiner* — Jeremy Norris
*Assistant Examiner* — Tremesha S Willis
(74) *Attorney, Agent, or Firm* — Altis Law Group, Inc.

(57) ABSTRACT

A printed circuit board includes a signal layer and a reference layer. The signal layer is covered with copper foil. A circuit topology for multiple loads is set on the signal layer. The circuit topology includes a driving terminal, a first signal receiving terminal, and a second signal receiving terminal. The driving terminal is connected to a node through a first transmission line. The node is connected to the first and second signal receiving terminals respectively through a second and a third transmission lines. A difference between lengths of the second and third transmission lines is greater than a product of a transmission speed and a rise time of signals from the driving terminal. The reference layer is covered with copper foil, and arranged under the signal layer. A region without copper foil is formed on the reference layer, under the second transmission line.

5 Claims, 5 Drawing Sheets

PRINTED CIRCUIT BOARD WITH CIRCUIT TOPOLOGY

BACKGROUND

1. Technical Field

The present disclosure relates to a printed circuit board (PCB).

2. Description of Related Art

With the increasing speeds of integrated circuits (ICs), signal integrity is becoming one of the most pressing problem areas. Many factors, such as the parameters of the electrical elements of the PCB and the layout of the PCB, can affect the signal integrity, or lead to instability of the system, possibly even causing the system to breakdown. Thus, preserving signal integrity has become a key point in the design of a PCB.

Referring to FIG. 4, a related-art circuit topology coupling a driving terminal to two signal receiving terminals is shown. A driving terminal 10 is coupled to two signal receiving terminals 20 and 30 through corresponding transmission lines. The two signal receiving terminals 20 and 30 are connected together in a daisy-chain configuration. In this circuit topology, the distance a signal travels from the driving terminal 10 to the signal receiving terminal 20 is greater than the distance the signal travels from the driving terminal 10 to the signal receiving terminals 30.

Referring to FIG. 5, a graph illustrating signal waveforms 22 and 33 respectively obtained at receiving terminals 20 and 30 using the circuit topology of FIG. 4 is shown. Signals arriving at the receiving terminal 30 reflect back and forth along the transmission line causing "ringing" at the receiving terminal 20.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
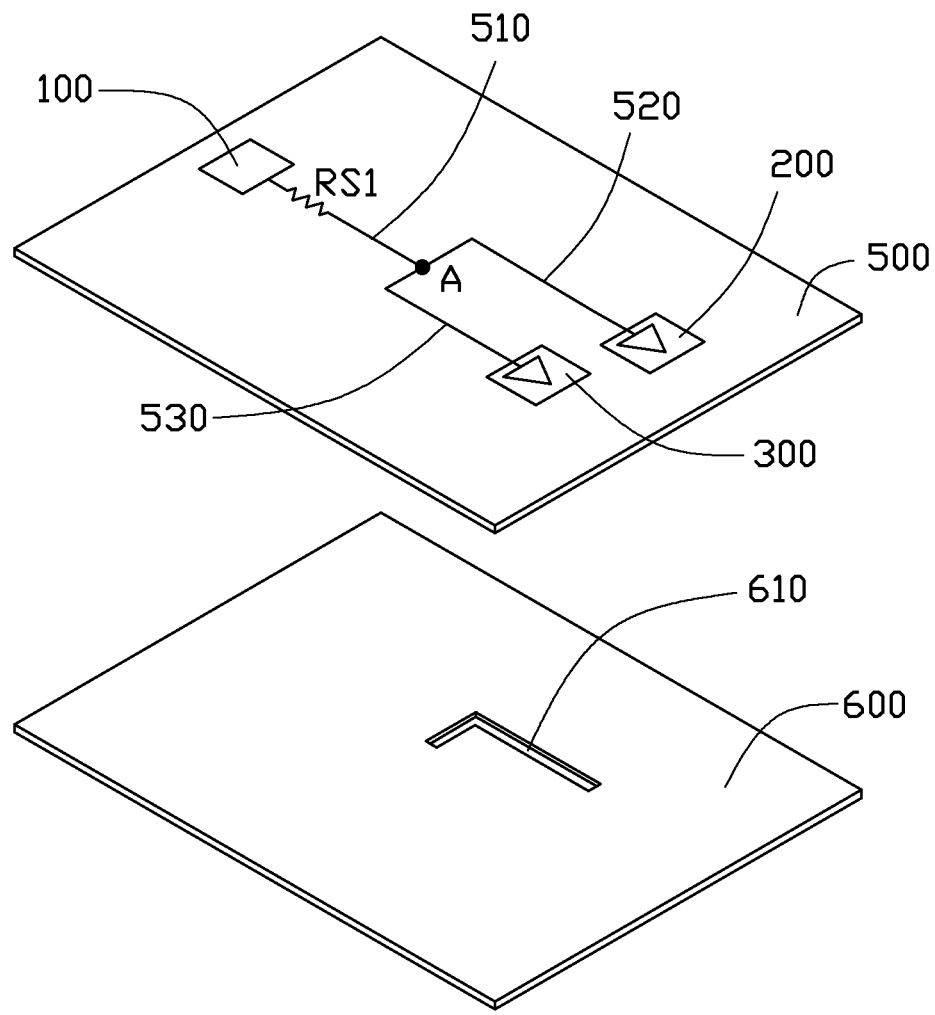
FIG. 1 is a block diagram of a printed circuit board in accordance with a first embodiment.

Referring to FIG. 1, a first exemplary embodiment of a printed circuit board includes a signal layer 500 and a reference layer 600. Copper foil are layered on the signal layer 500 and the reference layer 600. A circuit topology for multiple loads is set on the signal layer 500. The circuit topology includes a driving terminal 100, two signal receiving terminals 200 and 300, a resistor RS1, and transmission lines 510, 520, and 530. The driving terminal 100 is coupled to a node A through the transmission line 510. The node A is coupled to the signal receiving terminals 200 and 300 respectively through transmission lines 520 and 530. The resistor RS1 is connected between the driving terminal 100 and the node A. The resistance of the first resistor RS 1 is chosen to be matched with the impedance of the transmission line 510.

In this embodiment, the transmission line 520 is longer than the transmission line 530, and the difference between the length of the transmission line 520 and 530 is greater than the product of a transmission speed and a rise time of the signal from the driving terminal 100.

The reference layer 600 is arranged under the signal layer 500. A region 610 without copper foil is formed on the reference layer 600, under the transmission line 520. As a result, the resistance of the transmission line 520 increases, such that more current can flow through the transmission line 530. Therefore, signal reflections from the signal receiving terminals 200 and 300 is reduced, and signal integrity at the signal receiving terminals 200 and 300 is improved. The region 610 has a same shape as the transmission line 520.

Figure 2:
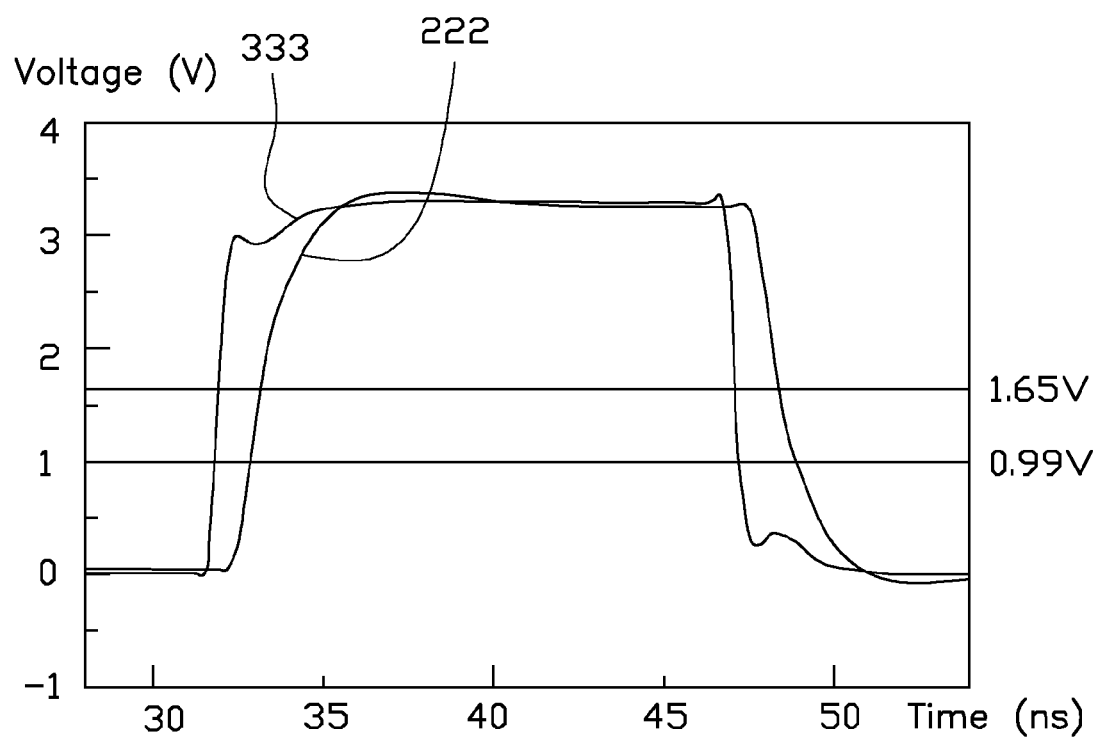
FIG. 2 is a comparative graph showing signal waveforms obtained at each signal receiving terminal using the printed circuit board of FIG. 1.

FIG. 2 is a graph showing signal waveforms obtained at each signal receiving terminal 200 and 300 using the circuit topology of FIG. 1. Signal waveforms 222 and 333 are corresponding to the signal receiving terminals 200 and 300. The signal reflections are reduced and signal integrity is improved at the signal receiving terminals 200 and 300.

In the first embodiment, the circuit topology just includes two branches. In other embodiments, the circuit topology may include more than two branches. In this condition, for each branch, if the difference between the lengths of the two transmission lines is greater than the product of a transmission speed and a rise time of the signal from the driving terminal 100, a region without copper foil is formed on the reference layer 600, under the longer transmission line. As a result, signal integrity at the signal receiving terminals can be improved.

Figure 3:
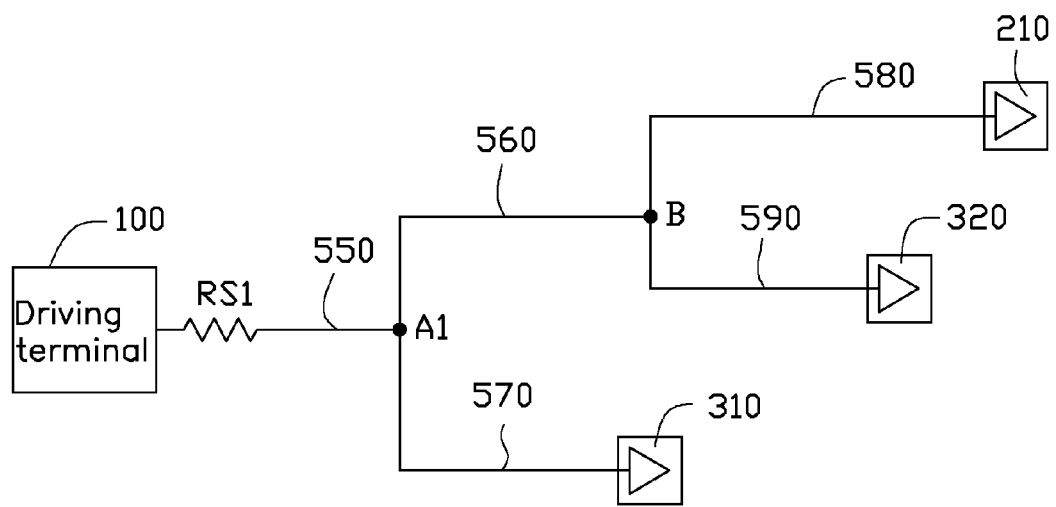
FIG. 3 is a block diagram of a printed circuit board in accordance with a second embodiment.
Figure 4:
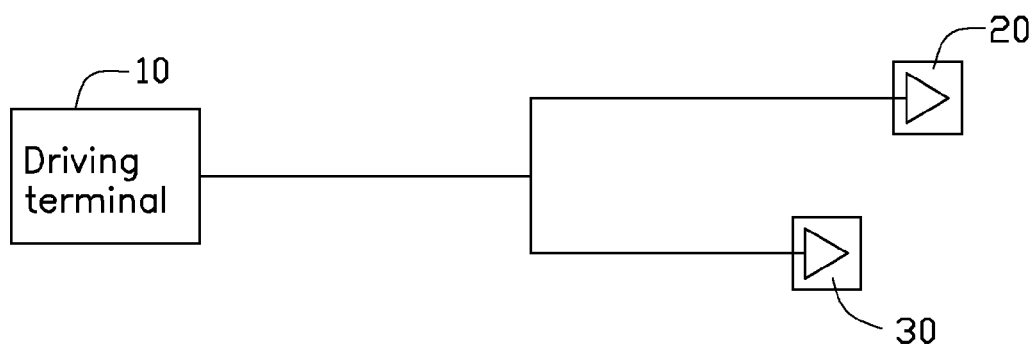
FIG. 4 is a block diagram of a related-art circuit topology coupling a driving terminal to two signal receiving terminals.
Figure 5:
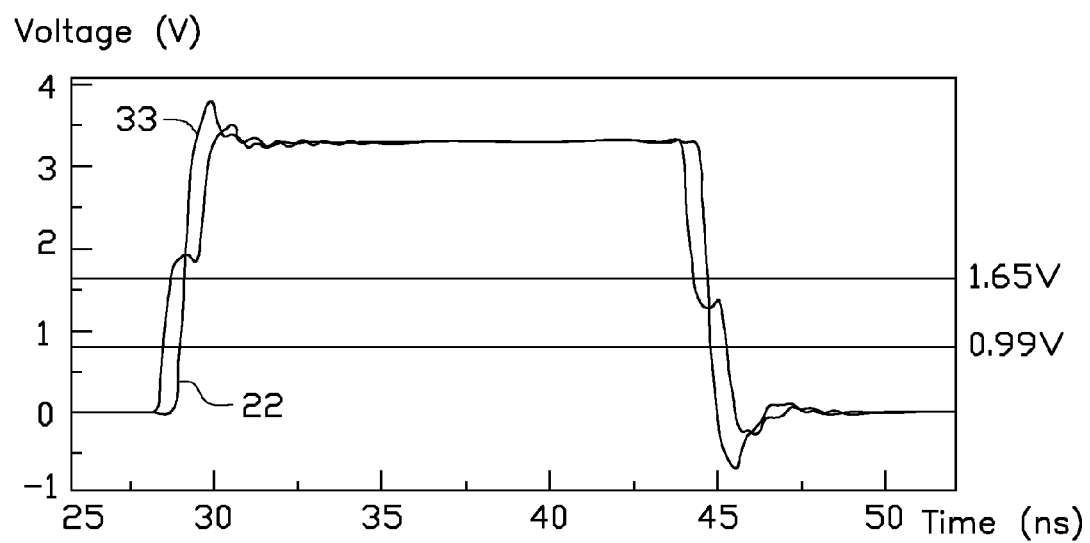
FIG. 5 is a comparative graph showing signal waveforms obtained at each signal receiving terminal using the circuit topology of FIG. 4.

Referring to FIG. 3, in a second embodiment of a printed circuit board, a circuit topology for multiple loads is set on a signal layer of the printed circuit board. The circuit topology includes a driving terminal 100, three signal receiving terminals 210, 310, and 320, a resistor RS1, and transmission lines 550, 560, 570, 580, and 590. The driving terminal 100 is coupled to a node A1 through the transmission line 550. The node A1 is coupled to the signal receiving terminal 310 and a node B respectively through the transmission lines 570 and 560. The node B is coupled to the signal receiving terminals 210 and 320 respectively through the transmission lines 580 and 590. The resistor RS1 is connected between the driving terminal 100 and the node A1. The resistance of the resistor RS1 is chosen to be matched the impedance of the transmission line 550.

The difference between an equivalent length of the transmission lines from the node A1 to the signal receiving terminals 210 and 320, and the transmission line 570 is greater than the product of a transmission speed and a rise time of the signal from the driving terminal 100. The difference between the length of the transmission lines 580 and 590 is greater than the product of the transmission speed and the rise time of the signal from the driving terminal 100. At this condition, a first region without copper foil is formed on the reference layer, under the transmission line 580, and a second region without copper foil is formed on the reference layer, under the transmission lines from the node A1 to the signal receiving terminals 210 and 320. As a result, signal integrity at the signal receiving terminals 210, 310, and 320 can be improved. As to the shape of the second region, operators may use emulation software for PCB to obtain the shape and the area of the second region.

The foregoing description of the exemplary embodiments of the disclosure has been presented only for the purposes of illustration and description and is not intended to be exhaustive or to limit the disclosure to the precise forms disclosed. Many modifications and variations are possible in light of everything above. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A printed circuit board comprising:
   a signal layer covered with a first copper foil, wherein a circuit topology for multiple loads is set on the signal layer, the circuit topology comprises a driving terminal, a first signal receiving terminal, and a second signal receiving terminal, the driving terminal is connected to a node through a first transmission line, the node is connected to the first signal receiving terminal through a second transmission line, the node is connected to the second signal receiving terminal through a third transmission line, the second transmission line is longer than the third transmission line, and a difference between lengths of the second and third transmission lines is greater than a product of a transmission speed and a rise time of signals from the driving terminal; and
   a reference layer, covered with a second copper foil, arranged under the signal layer, wherein a region without copper foil is formed on the reference layer, under the second transmission line.

2. The printed circuit board of claim 1, wherein the region has a same shape with the second transmission line.

3. The printed circuit board of claim 1, further comprising a resistor connected between the node and the driving terminal, wherein a resistance of the resistor is chosen to match with an impedance of the first transmission line.

4. A printed circuit board comprising:
   a signal layer covered with a first copper foil, wherein a circuit topology for multiple loads is set on the signal layer, the circuit topology comprises a driving terminal, a first signal receiving terminal, a second signal receiving terminal, and a third signal receiving terminal, the driving terminal is connected to a first node through a first transmission line, the first node is connected to the first signal receiving terminal and a second node respectively through a second transmission line and a third transmission line, the second node is connected to the second signal receiving terminal and the third signal receiving terminal respectively through a fourth transmission line and a fifth transmission line, a length of the second transmission line is less than an equivalent length from the first node to the second and third signal receiving terminals, a length of the fifth transmission line is less than a length of the fourth transmission line, a difference between the length of the second transmission line and the equivalent length from the first node to the second and third signal receiving terminals is greater than a product of a transmission speed and a rise time of signals from the driving terminal, a difference between the lengths of the fourth and fifth transmission lines is greater than the product of the transmission speed and the rise time of signals from the driving terminal; and
   a reference layer covered with a second copper foil, arranged under the signal layer, wherein a first region without copper foil is formed on the reference layer, under the fourth transmission line, and a second region without copper foil is formed on the reference layer, under a region from the first node to the second and third signal receiving terminals.

5. The printed circuit board of claim 4, further comprising a resistor connected between the first node and the driving terminal, wherein a resistance of the resistor is chosen to match with an impedance of the first transmission line.

* * * * *